US012574035B2

(12) United States Patent
Harush

(10) Patent No.: US 12,574,035 B2
(45) Date of Patent: Mar. 10, 2026

(54) INCREASING DYNAMIC RANGE OF A TIME-TO-DIGITAL CONVERTER

(71) Applicant: Cypress Semiconductor Corporation, San Jose, CA (US)

(72) Inventor: Avri Harush, Herzliya (IL)

(73) Assignee: Infineon Technologies Americas Corp., El Segundo, CA (US)

( * ) Notice: Subject to any disclaimer, the term of this patent is extended or adjusted under 35 U.S.C. 154(b) by 113 days.

(21) Appl. No.: 18/431,182

(22) Filed: Feb. 2, 2024

(65) Prior Publication Data

US 2025/0253854 A1    Aug. 7, 2025

(51) Int. Cl.
 *H03M 1/12*    (2006.01)
 *G04F 10/00*    (2006.01)
 *H03L 7/085*    (2006.01)
(52) U.S. Cl.
 CPC ............ *H03L 7/085* (2013.01); *G04F 10/005* (2013.01)

(58) Field of Classification Search
 CPC .................................. H03L 7/85; H04F 10/005
 USPC .................................................... 341/166, 155
 See application file for complete search history.

(56) References Cited

U.S. PATENT DOCUMENTS 7,126,404 B1 * 10/2006 Rosen ................... H03L 7/0814
                                                       327/272
2021/0270681 A1 * 9/2021 Herceg ................ G01K 15/005

* cited by examiner

*Primary Examiner* — Peguy Jean Pierre

(57) ABSTRACT

A time-to-digital converter (TDC) circuit including serially-coupled delay units is disclosed. A feedback loop is coupled between a final delay unit of the serially-coupled delay units and an input to the serially-coupled delay units. A counter with a clock input is coupled to an output of the final delay unit. A value of the counter is to be incremented responsive to the counter receiving a toggle signal from the final delay unit.

19 Claims, 6 Drawing Sheets

500

TRACK, BY SERIALLY-COUPLED DELAY UNITS, AN AMOUNT OF DELAY IN RESPONSE TO RECEIPT OF A START SIGNAL 502

OUTPUT, BY THE FINAL DELAY UNIT, A TOGGLE SIGNAL 504

INCREMENT, BY THE COUNTER, A FIRST VALUE OF THE COUNTER IN RESPONSE TO RECEIPT OF THE TOGGLE SIGNAL 506

LATCH, BY THE PLURALITY OF FLIP-FLOPS, SECOND VALUES CORRESPONDING TO OUTPUTS FROM THE RESPECTIVE ONES OF THE SERIALLY-COUPLED DELAY UNITS 508

RETAIN, BY THE COUNTER, THE FIRST VALUE 510

GENERATE, USING THE FIRST VALUE AND THE SECOND VALUES, A DIGITAL CODE 512

FIG. 5

INCREASING DYNAMIC RANGE OF A TIME-TO-DIGITAL CONVERTER

BACKGROUND

Phase-Locked Loops (PLLs) are frequently used in modern electronic systems, such as for frequency synthesis and clock generation. A PLL typically includes at least a phase detector, a loop filter, and an oscillator. Some PLLs utilize phase detectors to compare the phase of a reference signal with that of the signal from the oscillator. However, the resolution and response speed of these conventional phase detectors may have a limited dynamic range, posing challenges in applications requiring high precision and rapid phase alignment.

Some PLL designs may utilize a Vernier time-to-digital converter (TDC) circuit to compare a phase of the reference signal to the signal from the oscillator. A Vernier TDC operates by serially-coupling delay circuitry and measuring how far a start signal is propagated through the delay circuitry before a stop signal is received. By determining how a time difference between how far the first signal propagates through the delay circuitry before the second signal is received, a time difference between the start signal and stop signal can be measured. A phase difference between the reference signal and the signal from the oscillator can then be calculated using the time difference and the phase difference used to lock onto a target phase.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

FIG. 5 is a flowchart illustrating a method of operation of a TDC, according to one embodiment.

DETAILED DESCRIPTION

Figure 1:
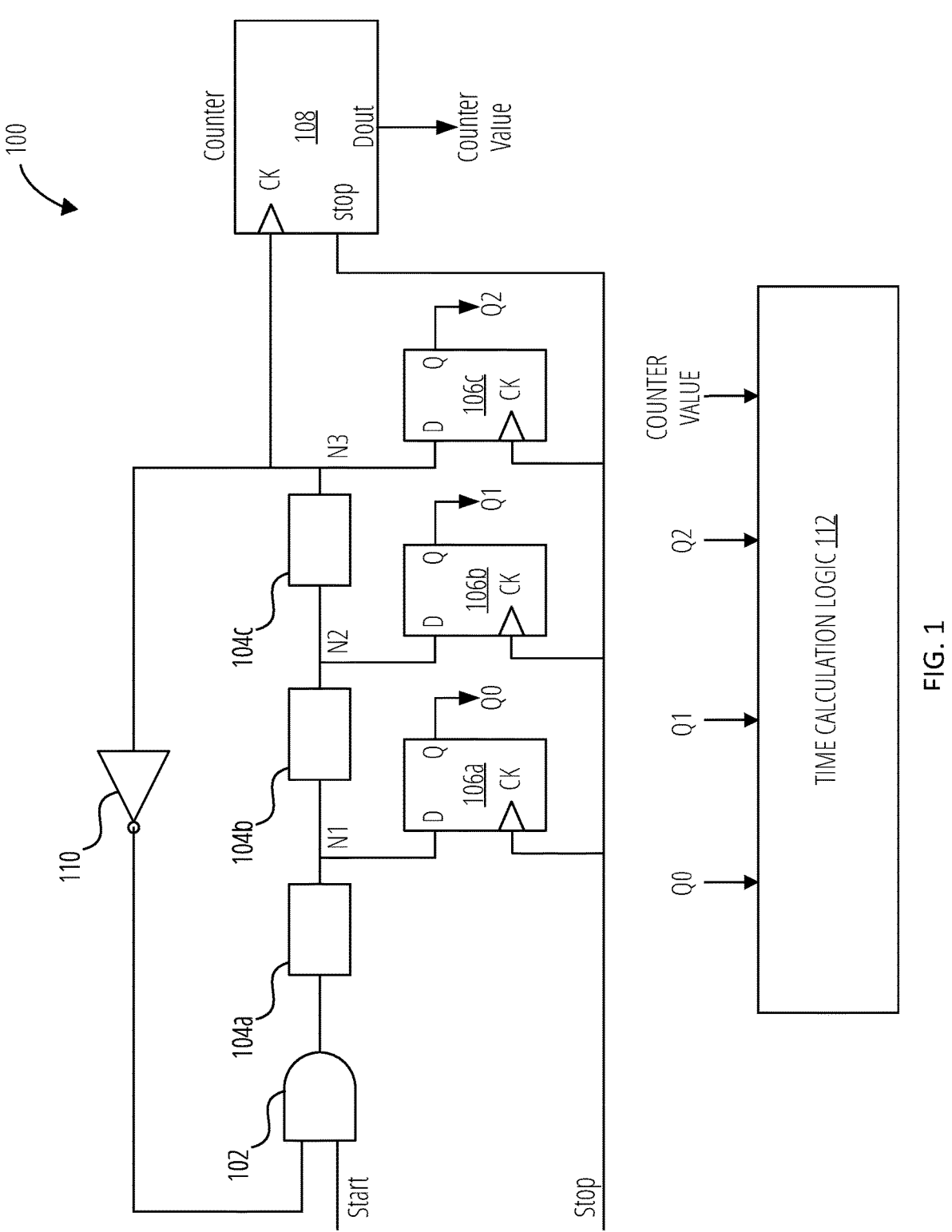
FIG. 1 is a circuit diagram of a time-to-digital converter (TDC) circuit with delay circuitry and a counter, according to one embodiment.

The following description sets forth numerous specific details such as examples of specific systems, components, methods, and so forth, in order to provide a good understanding of various embodiments of a circuit configured to calibrate a duty cycle within a phase-locked loop (PLL) described herein. Such PLLs may be employed in Internet of Things (IoT) applications or in any number of other applications such as home automation and security. It will be apparent to one skilled in the art, however, that at least some embodiments may be practiced without these specific details. In other instances, well-known components, elements, or methods are not described in detail or are presented in a simple block diagram format in order to avoid unnecessarily obscuring the subject matter described herein. Thus, the specific details set forth hereinafter are merely exemplary. Particular implementations may vary from these exemplary details and still be contemplated to be within the spirit and scope of the present embodiments.

Reference in the description to "an embodiment," "one embodiment," "an example embodiment," "some embodiments," and "various embodiments" means that a particular feature, structure, step, operation, or characteristic described in connection with the embodiment(s) is included in at least one embodiment. Further, the appearances of the phrases "an embodiment," "one embodiment," "an example embodiment," "some embodiments," and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

Technologies directed to increasing a dynamic range of a time-to-digital converter (TDC) circuit are described. A TDC may be used within a phase-locked loop (PLL) to determine a phase difference between two signals, such as a reference signal and a signal generated by an oscillator of the PLL. A TDC may also be used in other applications that require more precise measurements between two events, such as medical imaging, light detection and ranging (LIDAR) systems, optical fiber networks, wireless networking, or quantum computing.

A Vernier TDC is a particular type of TDS that measures phase difference between the reference signal and the signal generated by the oscillator by determining how many units (e.g., circuit components) of delay circuitry the start signal propagates through before the stop signal is received. Each unit of delay circuitry, such as a buffer, may be designed to incur a uniform delay of the propagation of the start signal. In general, a dynamic range of a Vernier TDC is linearly proportional to the respective number of units of delay circuitry. In other words, a maximum phase difference measurable by the Vernier TDC is linearly proportional to the number of units of delay circuitry within the Vernier TDC. For example, if each unit of delay circuitry was designed to delay the start signal by 10 picoseconds (ps), which is provided herein only by way of example for explanation purposes, the Vernier TDC would need ten units of delay circuitry to measure a phase difference corresponding to 100 ps. Similarly, the Vernier TDC would need one hundred units of delay circuitry to measure a phase difference corresponding to one nanosecond (ns). As such, increasing the dynamic range of a conventional Vernier TDC detrimentally increases both chip real estate and power required.

Aspects and embodiments of the present disclosure provide a power-efficient and area-efficient TDC while increasing dynamic range. The disclosed TDC includes multiple serially-coupled delay units. A feedback loop may be coupled between a final unit of the serially-coupled units and an input to the serially-coupled units. The feedback loop may include an inverter. A counter may also be coupled to the final unit. In some embodiments, a clock input of the counter is coupled to an output of the final unit. The counter may increment each time a toggle signal (e.g., a rising edge or a falling edge) is received at the clock input. Each output of the serially-coupled units of delay circuitry may be coupled to a first input of a different flip-flop. A second input of each flip-flop may be configured to receive a stop signal and latch values (e.g., second values) corresponding to signals received at the first input of each flip-flop.

In some embodiments, a start signal is received at the input to the serially-coupled delay units and propagates through the serially-coupled delay units to the counter. The counter may increment a value, and the start signal may be toggled by the inverter. The input to the serially-coupled delay units may then receive the toggled signal, which propagates through the serially-coupled delay units to the counter. In some embodiments, the counter increments the value again, and the toggled signal is re-toggled by the inverter. This process is repeated until the stop signal is received, at which time the flip-flops may latch respective values of received signals (e.g., second values) and the counter may output the value (e.g., first value).

Aspects and embodiments of the present disclosure also provide a TDC recovery system with an increased dynamic range. In some embodiments, the TDC recovery system includes both a high-resolution TDC and a low-resolution TDC. Delay circuitry of the high-resolution TDC may cause shorter time delays (e.g., fine delays), while delay circuitry of the low-resolution TDC may cause longer time delays (e.g., coarse delays). In some embodiments, the low-reso- lution TDC measures a time difference between the start signal and the stop signal only if the time difference is too large for the high-resolution TDC to measure. In other words, the low-resolution TDC may measure a time differ- ence between the start signal and the stop signal only if the time difference is too large for the dynamic range of the high-resolution TDC. In some embodiments, the low-reso- lution TDC may by automatically triggered after the dynamic range of the high-resolution TDC has been reached.

FIG. 1 is a circuit diagram of a time-to-digital converter (TDC) circuit 100 with delay circuitry and a counter 108, according to one embodiment. In some embodiments, the TDC circuit 100 may include an AND gate 102 that receives a start signal at a first input. The start clock signal may be a rising edge of a first clock. The AND gate 102 may be coupled to an input of a first delay unit 104a. In some embodiments, as illustrated, delay units 104a, 104b, 104c may be serially-coupled and/or serially-connected. In some embodiments, the counter 108 is a single-edge-triggered counter that is incremented on only one type of transitions, e.g., either a rising or a falling edge. In other embodiments, the counter 108 is a dual-edge-triggered counter that is incremented on either type of transitions, e.g., the rising and the falling edges of an input clock.

In various embodiments, an output of the first delay unit 104a is coupled, at a first node N1, to a second delay unit 104b and a first input of a first flip-flop 106a. The first node N1 may transmit a first signal. An output of the second delay unit 104b may be coupled, at a second node N2, to an input of a third delay unit 104c and a first input of a second flip-flop 106b. The second node N2 may transmit a second signal. The third delay unit 104c may be considered a final delay unit in this particular example of three delay units. An output of the third delay unit 104c may be coupled, at a third node N3, to a first input of a third flip-flop 106c, an input of the counter 108, and an input of an inverter 110. The third node N3 may transmit a third signal that is also referred to herein as a toggle signal due to causing the counter 108 to increment a counter value of the counter 108. If the counter 108 is dual-edge trigged, the counter 108 may be incre- mented in response to a delay signal passing through the serially-coupled delay units, e.g., each time through all of the delay units 104a-104c.

In various embodiments, an output of the inverter 110 may be coupled to a second input of the AND gate 102. A fourth signal may be transmitted between the output of the inverter 110 and the second input of the AND gate 102. A fifth signal may be transmitted between the output of the AND gate and the input of the first delay unit 104a. In various embodiments, the inverter 110 may create a feed- back loop between the third delay unit 104c and the AND gate 102. The input to the counter 108 from a final delay unit (e.g., from the third delay unit 106c in this example) may function as a clock input that triggers the counter 108 to increment a counter value.

In some embodiments, the clock inputs of the flip-flops 106a, 106b, 106c are each configured to receive a stop signal. In some embodiments, the stop signal comes from a rising edge of a second clock. In response to receiving the stop signal, the flip-flops 106a, 106b, and 106c may each latch an output value of a respective delay unit 104a, 104b, and 140c, which values are made available at respective outputs of the flip-flops 106a, 106b, and 106c (i.e., Q0, Q1, and Q2).

In some embodiments, a second input of the counter 108 (e.g., stop input) is configured to receive the stop signal. In response to receiving the stop signal, the counter 108 may stop incrementing the counter value and retain the counter value that is provided at an output of the counter 108. The counter 108 may generate the counter value in a format similar to, or consistent with, the latched values of the flip-flops 106a, 106b, 106c. Combined, the latched values of the flip-flops 106a, 106b, 106c and the value of the counter 108 may form a digital code that may be sent to a digitally- controlled oscillator (DCO), for example.

In some embodiments, the AND gate 102, delay units 104a, 104b, 104c, and inverter 110 create a loop that provides a feedback signal in response to receiving and propagating the start signal through the loop. The loop may be configured to invert a toggle signal, output by the final delay unit, each time the toggle signal transitions (e.g., between HIGH and LOW or between LOW and HIGH). In at least some embodiments, the delay units 104a, 104b, 104c and the counter 108 are configured to track an amount of delay (e.g., time difference) between receipt of the start signal and receipt of the stop signal. For example, as illustrated, before the start signal transitions to HIGH, the output of the inverter 110 is HIGH, which means the second input of the AND gate 102 is also HIGH. Therefore, in some embodiments, when a start signal is received by the TDC circuit 100 at the first input of the AND gate 102, the output of the AND gate 102 transitions HIGH and each of the nodes N1, N2, and N3 respectively transitions to HIGH after passing through each respective delay unit 104a, 104b, 104c (see FIGS. 2A-2B). Thus, the signals at nodes N1, N2, and N3 can be understood as delayed versions of start signals moving through the loop that ends with the counter 108.

In some embodiments, the third node N3 transitioning to HIGH causes the output of the inverter 110 to transition to LOW, which in turn causes the output of the AND gate 102 to transition to LOW. Each of the nodes N1, N2, and N3 may then respectively transition to LOW after passing through each respective delay unit 104a, 104b, 104c, and in response to the third node transitioning to LOW, the counter 108 may again be incremented. Further, when the toggle signal at node N3 is LOW, the output of the inverter may transition to HIGH and the output of the AND gate 102 may again transition to HIGH. This toggling cycle, from signal inversion, may be repeated until the start signal transitions to LOW and/or the stop signal is asserted, resetting the delay circuitry of the TDC circuit 100 to be prepared for being restarted again by the start signal.

While the start signal may continue to be iteratively delayed by the toggling cycle until the start signal toggles to LOW, each of the flip-flops 106a, 106b, 106c may latch values of a respective delayed versions of the start signal at each node in response to receiving the stop signal. For example, the start signal may be transitioning from LOW to HIGH at the transition edge. The transition edge may be propagating through the third delay unit 104c when the stop signal is received. So, in this example, the first node N1 is HIGH, the second node N2 is HIGH, and the third node N3 is LOW. Thus, in response to receiving the stop signal, the first flip-flop 106a latches a HIGH value, the second flip-flop 106b latches a HIGH value, and the third flip-flop 106c latches a LOW value. Different examples of the toggle signal are described below with respect to FIG. 2A, FIG. 2B, and FIG. 2C.

In some embodiments, the counter 108 may increment a counter value in response to the transition edge of the toggle signal (i.e., third signal). In other words, the counter 108 may increment the value in response to the third signal on the third node N3 transitioning from one or more of HIGH to LOW or LOW to HIGH. In at least one embodiment, the counter 108 may be a dual-edge counter that increments the value in response to the toggle signal transitioning from both HIGH to LOW and LOW to HIGH (e.g., all transitions of the toggle signal). In these embodiments, each increment of the value may correspond to a total time delay caused by the delay units 104a, 104b, 104c. In another embodiment, the counter 108 may be rising-edge triggered and increment the value in response to the toggle signal transitioning from LOW to HIGH. In another embodiment, the counter 108 may be falling-edge triggered and increment the value in response to the toggle signal transitioning from HIGH to LOW. In embodiments where the counter 108 is single-edge triggered (e.g., rising-edge triggered, falling-edge triggered), the counter 108 only increments the value upon alternating receipts of the toggle signal, as described above. Additionally, in embodiments where the counter 108 is single-edge triggered (e.g., rising-edge triggered, falling-edge triggered), the value incremented by the counter 108 may correspond to twice the total time delay caused by the delay units 104a, 104b, 104c.

Once the stop signal is received by the flip-flops 106a, 106b, 106c and the counter 108, the latched values of the flip-flops 106a, 106b, 106c—Q0, Q1, and Q2 respectively—and the counter 108 may be sent to time calculation logic 112. In some embodiments the outputs of the flip-flops 106a, 106b, 106c and the counter 108 are retrieved by the time calculation logic 112. The time calculation logic 112 may be hardware, software, firmware, or any combination thereof. In some embodiments, the time calculation logic 112 may include circuitry or circuit components that generate a digital code. The digital code may be configured to control a DCO. The digital code may be generated by combining the latched values of the flip-flops 106a, 106b, 106c and the value of the counter. The value of the counter may be outputted as multiple binary values. In some embodiments, the time calculation logic 112 may be a hardware component (e.g., a field-programmable gate array (FPGA)) or a logic component (e.g., software in an FPGA).

In various embodiments, the time calculation logic 112 uses the flip-flop output values Q0, Q1, Q2 and the value of the counter 108 to determine how much time passed between the TDC circuit 100 receiving the start signal and the TDC circuit 100 receiving the stop signal. This approximate time may then be used to determine a phase difference between two signals, such as a reference signal and a signal generated by an oscillator of a PLL. For example, if each of the delay units 104a, 104b, 104c were designed to cause a ten ("10") picosecond delay, the counter 108 may be a dual-edge counter, Q0 is LOW, Q1 is HIGH, Q2 is HIGH, and the value is equal to one ("1"). In this embodiment, the time calculation logic 112 may determine that between 40 ps and 50 ps passed between the TDC circuit 100 receiving the start signal and the stop signal. In some embodiments, the time calculation logic 112 may part of the TDC circuit 100. In other embodiments, the time calculation logic 112 may be part of a different component, such as a phase detector (PD) of a PLL.

In some embodiments, the delay units 104a, 104b, 104c may be serially-connected. In other embodiments, the delay units 104a, 104b, 104c may be serially-coupled (e.g., serially-coupled delay units) with intervening circuitry. In some embodiments, the delay units 104a, 104b, 104c may be designed to cause similar time delays. In other embodiments, the delay units 104a, 104b, 104c may be designed to cause different time delays. The delay units 104a, 104b, 104c may include multiple serially-coupled inverters. The delay units 104a, 104b, 104c may include multiple interpolators, which can have shorter time delays than inverters. In some embodiments, the delay units 104a, 104b, 104c may include a combination of inverters and interpolators. In various embodiments, the delay units 104a, 104b, 104c may include other hardware components, such as capacitors, inductors, transistors, traces, or buffers.

In some embodiments, the flip-flops 106a, 106b, 106c may be replaced with any other component or application that includes an ability to latch a value of a signal observed at a first input in response to a rising (or falling) edge of a second input. Some of these components or applications may include relays, optical memory devices, or memristors.

The TDC circuit 100, as illustrated, is merely intended to be exemplary. In practice, the TDC circuit 100 may have a different number of delay units and corresponding flip-flops. Additionally, the loop created by the AND gate 102, the delay units 104a, 104b, 104c, and the inverter 110 may be implemented in various ways that result in incrementing a value of a counter upon a start signal propagating through delay circuitry. In some embodiments, the counter 108 may be coupled to a different location on the loop created, such as before the first delay unit 104a.

Figures 2A, 2B:
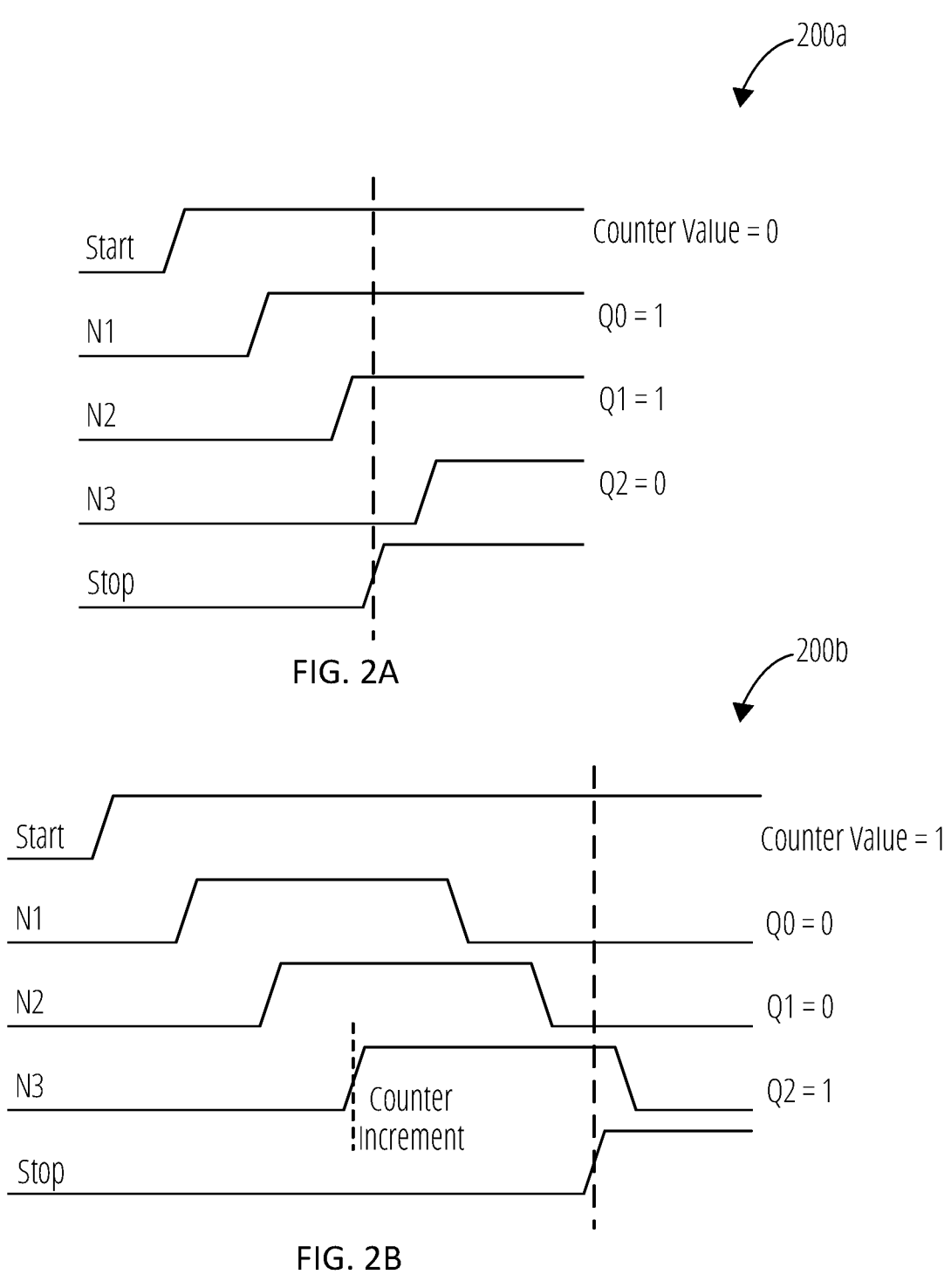
FIG. 2A is a signal diagram illustrating the TDC receiving a stop signal before incrementing a counter, according to one embodiment.
FIG. 2B is a signal diagram illustrating the TDC receiving a stop signal after incrementing a counter a single time, according to one embodiment.
Figure 2C:
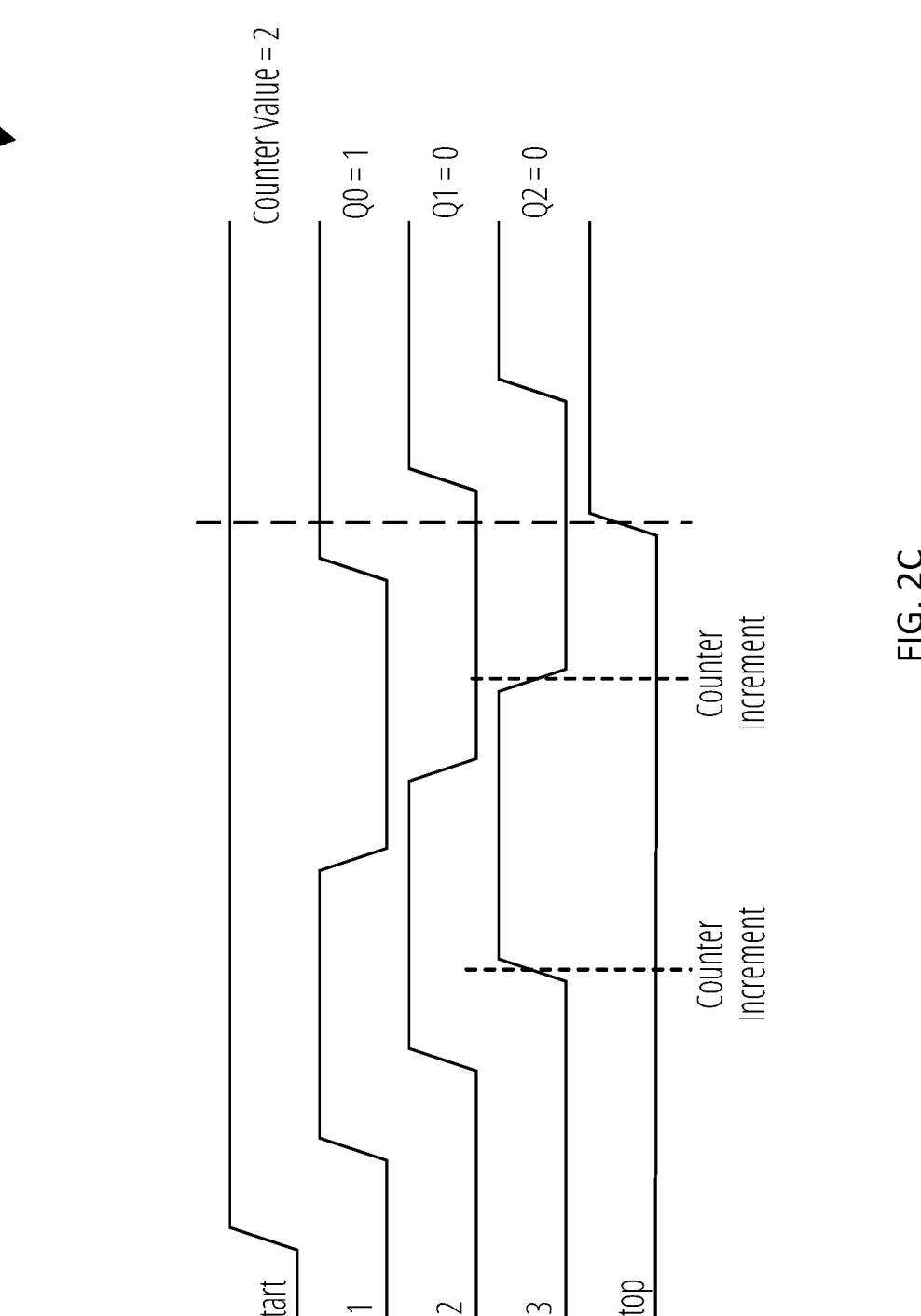
FIG. 2C is a signal diagram illustrating the TDC receiving a stop signal before incrementing a counter multiple times, according to one embodiment.

FIG. 2A-C are signal diagrams 200a, 200b, 200c illustrating the TDC circuit 100 receiving a stop signal after various amounts of time. The signal diagrams 200a, 200b, 200c include voltage levels over time of a start signal, a stop signal, and three signals on the first node N1 (first signal), the second node N2 (second signal), and the third node N3 (third signal). The first, second, and third signals may correspond to nodes N1, N2, N3 as described above with respect to FIG. 1. Time increases from left-to-right.

The signal diagrams 200*a*, 200*b*, 200*c* are merely intended to be exemplary and illustrate various time differences between the TDC circuit 100 receiving the start signal and the stop signal. In practice, the teachings and embodiments of the present disclosure may be implemented in many different ways, as described above.

FIG. 2A is a signal diagram illustrating the TDC receiving a stop signal before incrementing a counter (e.g., the counter 108), according to one embodiment. In some embodiments, before the start signal is received, each of the first, second, and third signals are LOW. After the start signal is received (e.g., the start signal transitions to HIGH), each of the inputs of the AND gate 102 are HIGH and the fifth signal (i.e., output of the AND gate 102) transitions to HIGH. In some embodiments, the first, second, third, fourth, and fifth signals, as described above with respect to FIG. 1, digitally transition between HIGH and LOW upon each signal inversion via the inverter 110. In response to the fifth signal transitioning to HIGH, the first signal transitions to HIGH. The first signal may transition to HIGH in response to a transition edge propagating through the first delay unit 104*a*. The transition edge may be a digital transition between LOW and HIGH (e.g., a rising edge or falling edge). In some embodiments, the transition edge is a rising edge.

After the first signal transitions to HIGH, the second signal transitions to HIGH. The second signal may transition to HIGH in response to the transition edge propagating through the second delay unit 104*b*.

After the second signal transitions to HIGH but before the third signal transitions to HIGH, the TDC circuit 100 may receive the stop signal (e.g., the stop signal transitions to HIGH). In some embodiments, the third signal may not yet have transitioned to HIGH because the transition edge had not yet propagated through the third delay unit 104*c*. Responsive to the TDC circuit 100 receiving the stop signal, flip-flops latch values of the first, second, and third signals and output these values Q0, Q1, and Q2, respectively, as described above with respect to FIG. 1. Because the stop signal was received after the first and second signals transitioned to HIGH, Q0 and Q1 are equal to "1" (i.e., HIGH). Because the stop signal was received before the third signal transitions to HIGH, Q2 is equal to "0" (i.e., LOW).

After the TDC circuit 100 has received the stop signal, the third signal may transition to HIGH. However, because a LOW value of the third signal was latched by a flip-flop before transitioning to HIGH, the output of the flip-flop (i.e., Q2) is "0". Additionally, a value of a counter may be equal to zero because the transition edge had not yet propagated through the third delay unit 104*c*.

So, for the example illustrated by the signal diagram 200*a*, logic (e.g., the time calculation logic 112) that receives the outputs Q0, Q1, Q2 of the flip-flops and the value of the counter may determine that a time difference between receiving the start signal and the stop signal is equal to at least a sum of a first time delay caused by the first delay unit 104*a* and a second time delay caused by the second delay unit 104*b*. For example, if the first and second delay units 104*a*, 104*b* each caused a 10 picosecond delay, the logic may determine that the time difference between receiving the start signal and the stop signal is at least 20 ps. In some embodiments, a digital code representing the at least 20 ps delay is generated by combining Q0, Q1, Q2, and the value of the counter. The digital code may be sent to one or more of a digital filter or a DCO.

FIG. 2B is a signal diagram 200*b* illustrating the TDC circuit 100 receiving a stop signal after incrementing a counter (e.g., the counter 108) a single time, according to one embodiment. In some embodiments, before the start signal is received, each of the first, second, and third signals are LOW. After the start signal is received, the first, second, and third signals may each respectively transition to HIGH. Each of the first, second, and third signals may transition to HIGH after the transition edge propagates through respective units of the delay circuitry (e.g., the delay units 104*a*, 104*b*, 104*c*). In some embodiments, the transition edge is a rising edge that transitions each of the first, second, and third signals to HIGH.

In response to the third signal (e.g., toggle signal) transitioning to HIGH, a value of the counter may be incremented from zero (0) to one (1). The value may represent a number of times that the third signal has transitioned to HIGH. In some embodiments, the value may represent a number of times that the third signal has transitioned between HIGH and LOW. The counter may receive the third signal as a clock input.

After the third signal (e.g., toggle signal) transitions to HIGH, the first signal may transition to LOW. The first signal may transition to LOW after the transition edge is inverted via an inverter (e.g., the inverter 110) and is fed back to the AND gate 102. Upon each time propagating through the inverter 110, the transition edge may toggle between a rising edge and falling edge. The first signal may transition to LOW in response to the inverted transition edge propagating through the first delay unit 104*a*. In some embodiments, the inverted transition edge is a falling edge.

After the first signal transitions to LOW, the second signal transitions to LOW. The second signal may transition to LOW in response to the inverted transition edge propagating through the second delay unit 104*b*.

After the second signal transitions to LOW but before the third signal transitions to LOW, the TDC circuit 100 may receive the stop signal (e.g., the stop signal is asserted). In some embodiments, the third signal may not yet have transitioned to LOW because the inverted transition edge had not yet propagated through the third delay unit 104*c*. Responsive to the TDC circuit 100 receiving the stop signal, flip-flops latch respective values of the first, second, and third signals, and output Q0, Q1, and Q2, respectively. Because the stop signal was received after the first and second signals transitioned to LOW, Q0 and Q1 are equal to "0" (i.e., LOW). Because the stop signal was received before the third signal transitions to LOW, Q2 is equal to "1" (i.e., HIGH).

After the TDC circuit 100 has received the stop signal, the third signal may transition to LOW. However, because a HIGH value of the third signal was latched by a flip-flop before the third signal transitioned to LOW, the output of the respective flip-flop (i.e., Q2) is "1." Additionally, a value of a counter may be equal to one ("1") because the transition edge only caused the third signal to transition between HIGH and LOW a single time. The counter may stop incrementing the value and retain the value of one ("1") in response to the TDC circuit 100 receiving the stop signal.

Logic (e.g., the time calculation logic 112) may receive the outputs Q0, Q1, Q2 of the flip-flops and the value of the counter and may determine a time difference between receiving the start signal and the stop signal. The value of the counter may indicate (e.g., be associated with) a primary time delay how many times the transition edge completely propagated through the delay circuitry. The outputs Q0, Q1, Q2 of the flip-flops may indicate (e.g., be associated with) a residual time delay, i.e., how far the transition edge propagated through the delay circuitry a last time before the stop signal was received by the TDC circuit 100. The time difference between receiving the start signal and the stop signal may be determined by combining the primary time difference and the residual time difference. The time difference may then be used to determine a phase difference between two signals, such as a reference signal and a signal generated by an oscillator of a PLL.

As an exemplary embodiment of the signal diagram 200*b*, if the first, second, and third delay units 104*a*, 104*b*, 104*c* each caused a ten (10) picosecond delay, the logic may determine that the time difference between receiving the start signal and the stop signal is at least 50 ps. The primary time delay may be equal to 30 ps, as the value of the counter is equal to one ("1") and the transition edge takes at least 30 ps to pass through the delay circuitry (i.e., summation of the first, second, and third delay units 104*a*, 104*b*, 104*c*). In other words, the primary time delay may be equal to 30 ps because the delay of each of the units of the delay circuitry multiplied by the total number of units of the delay circuitry is equal to 30 ps. The residual time delay may be equal to 20 ps, as Q0 is "0", Q1 is "0", and Q2 is "1", which indicates that the transition edge propagated through the first and second delay units 104*a*, 104*b* of the delay circuitry—and not the third delay unit 104*c*—before the stop signal was received. In some embodiments, a digital code representing the at least 50 ps delay is generated by combining Q0, Q1, Q2, and the value of the counter. The digital code may be sent to one or more of a digital filter or a DCO.

FIG. 2C is a signal diagram illustrating the TDC receiving a stop signal before incrementing a counter (e.g., the counter 108) multiple times, according to one embodiment. In some embodiments, before the start signal is received, each of the first, second, and third signals are LOW. After the start signal is received, each of the first, second, and third signals may each respectively transition to HIGH. Each of the first, second, and third signals may transition to HIGH after the transition edge propagates through respective units of the delay circuitry (i.e., the delay units 104*a*, 104*b*, 104*c*). In some embodiments, the transition edge is a rising edge that transitions each of the first, second, and third signals to HIGH.

In response to the third signal transitioning to HIGH, a value of the counter may be incremented from zero (0) to one (1). The value may represent a number of times that the third signal has transitioned between HIGH and LOW. The counter may receive the third signal as a clock input.

After the third signal (e.g., toggle signal) transitions to HIGH, the first, second, and third signals may transition to LOW. The first, second, and third signals may transition to LOW after the inverted transition edge is inverted via an inverter (e.g., the inverter 110) and is fed back to the AND gate 102. Upon each time propagating through the inverter 110, the transition edge may toggle between a rising edge and falling edge. In some embodiments, the inverted transition edge is a falling edge.

The inverted transition edge, after propagating through the third delay unit 104*c*, may cause the third signal to transition to LOW (e.g., inverted toggle signal). In response to the third signal transitioning to LOW, the value of the counter may be incremented from one (1) to two (2). After the third signal transitions to LOW, the inverter 110 inverts the inverted transition edge into a twice-inverted transition edge. The twice-inverted transition edge may be a rising edge. In response to the twice-inverted transition edge propagating through the first delay unit 104*a*, the first signal may transition back to HIGH.

After the first signal transitions back to HIGH but before the second signal transitions back to HIGH, the TDC circuit 100 may receive the stop signal (e.g., the stop signal transitions to HIGH). In some embodiments, the second and third signals may not yet have transitioned back to HIGH because the twice-inverted transition edge had not yet propagated through the second delay unit 104*b*. Responsive to the TDC circuit 100 receiving the stop signal, flip-flops latch respective values of the first, second, and third signals and output Q0, Q1, and Q2 respectively. Because the stop signal was received after the first signal transitioned back to HIGH, Q0 is equal to "1" (i.e., HIGH). Because the stop signal was received before the second and third signals transitioned back to HIGH, Q1 and Q2 are equal to "0" (i.e., LOW).

After the TDC circuit 100 has received the stop signal, the second signal may transition back to HIGH. The third signal may also transition back to HIGH (e.g., twice-inverted toggle signal). However, because a LOW value of the second signal and a LOW value of the third signal were latched by respective flip-flop 106*b*, 106*c* before the second and third signals respectively transitioned to HIGH, the outputs of the respective flip-flops 106*b*, 106*c* (i.e., Q1, Q2) are "0." Additionally, the value of the counter 108 may be equal to two ("2") because the transition edge caused the third signal to transition between HIGH and LOW twice. The counter may stop incrementing the value and retain the value of two ("2") in response to the TDC circuit 100 receiving the stop signal.

Logic (e.g., the time calculation logic 112) may receive the outputs Q0, Q1, Q2 of the flip-flops and the value of the counter and may determine a time difference between receiving the start signal and the stop signal. The value of the counter may indicate (e.g., be associated with) a primary time delay how many times the transition edge completely propagated through the delay circuitry. The outputs Q0, Q1, Q2 of the flip-flops may indicate (e.g., be associated with) a residual time delay, i.e., how far the transition propagated through the delay circuitry a last time before the stop signal was received by the TDC circuit 100. The time difference between receiving the start signal and the stop signal may be determined by combining the primary time difference and the residual time difference. The time difference may then be used to determine a phase difference between two signals, such as a reference signal and a signal generated by an oscillator of a PLL.

As an exemplary embodiment of the signal diagram 200*b*, if the first, second, and third portions of delay circuitry each caused a 10 picosecond delay, the logic may determine that the time difference between receiving the start signal and the stop signal is at least 70 ps. The primary time delay may be equal to 30 ps, as the value of the counter is equal to two ("2") and the transition edge takes at least 3030 to propagate through the entire delay circuitry (i.e., a summation of the first, second, and third delay units 104*a*, 104*b*, 104*c*) a single time. Additionally, a counter value of two indicates that the transition edge propagated through the entire delay circuitry twice. Therefore, the primary time delay may be at least 60 ps because the delay corresponding to each of the units of the delay circuitry multiplied by the number of units of the delay circuitry is equal to 30 ps, and 30 ps multiplied by two for each time the transition edge propagated through the entire delay circuitry is 60 ps. The residual time delay may be equal to 10 ps, as Q0 is "1," Q1 is "0," and Q2 is "0," which indicates that the transition edge propagated through only the first delay stage 104*a* before the stop signal was received. The primary and residual time delays combined, as illustrated in FIG. 2C, may be at least 70 ps. In some embodiments, a digital code representing the at least 70 ps delay is generated by combining Q0, Q1, Q2, and the value of the counter. The digital code may be sent to one or more of a digital filter or a DCO.

Figure 3:
FIG. 3 is a flow diagram illustrating a TDC recovery system, according to one embodiment.
Figure 3:
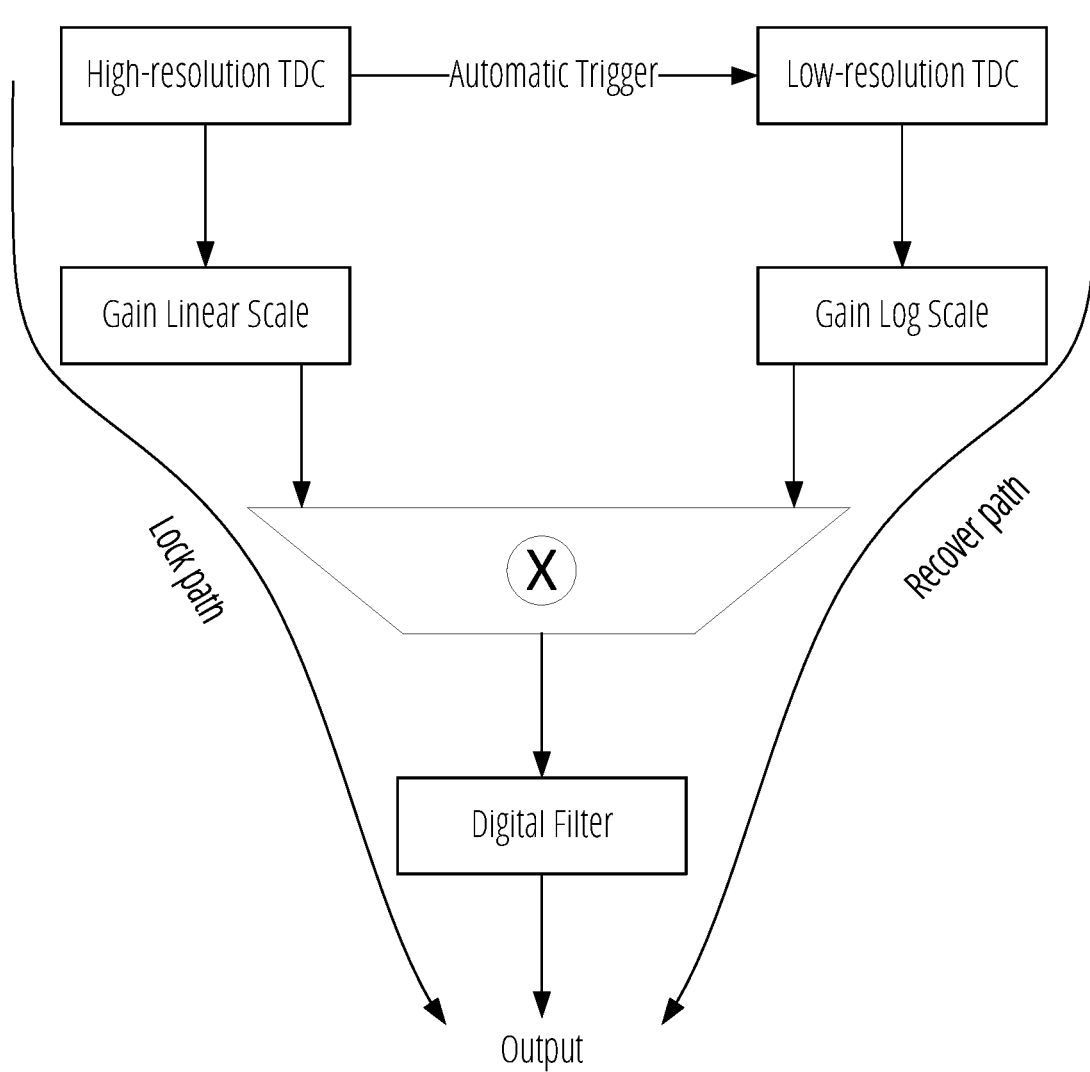

FIG. 3 is a flow diagram illustrating a TDC recovery system 300 for a PLL, according to one embodiment. The TDC recovery system 300 may facilitate a faster recovery of a PLL after a power-up of the PLL, a power surge inside of the PLL, or the like. The TDC recovery system 300 may include a high-resolution TDC 302 and a low-resolution TDC 304. The high-resolution TDC 302 may include delay units designed to cause shorter delays than delay units of the low-resolution TDC 304.

The high-resolution TDC 302 may include fine delay units (i.e., shorter delays) that allow logic (e.g., the time calculation logic 112) to provide a more accurate time difference between a start signal and a stop signal when the time difference is smaller than a dynamic range of the high-resolution TDC 302. As such, the high-resolution TDC 302 may be used by the PLL to adjust small deviations from a target phase difference. In some embodiments, the target phase difference is a desired phase difference between a reference signal and a signal generated by an oscillator of the PLL. In some embodiments, the high-resolution TDC 302 may be include some or all of the features of the TDC circuit 100 described above with respect to FIGS. 1-2C.

The low-resolution TDC 304 may include coarse delay units (i.e., longer delays) that allow the logic to provide an estimated time difference when the time difference is larger than the dynamic range of the high-resolution TDC 302. As such, the low-resolution TDC 304 may be used by the PLL to adjust large deviations from a target phase difference. In some embodiments, the low-resolution TDC 304 may be include some or all of the features of the TDC circuit 100 described above with respect to FIGS. 1-2C.

In some embodiments, the low-resolution TDC 304 is automatically triggered when a dynamic range limit of the high-resolution TDC 302 is reached. The dynamic range limit of the high-resolution TDC 302 may be reached any time that a large deviation from the target phase difference occurs, such as after a power-up of the PLL, a power surge inside of the PLL, or noise is introduced inside of the PLL.

After the high-resolution TDC 302 and low-resolution TDC 304 receive a stop signal and each output a set of digital data. A first set of digital data outputted by the high-resolution TDC 302 may correspond to outputs of flip-flops or counters of the high-resolution TDC 302. A second set of digital data outputted by the low-resolution TDC 304 may correspond to outputs of flip-flops or counter of the low-resolution TDC 304. If the dynamic range limit of the high-resolution TDC 302 was reached before the stop signal was received, a first set of digital data outputted by the high-resolution TDC 302 may correspond to the dynamic range limit.

The sets of digital data may be respectively scaled. The first set of digital data may be scaled by linear gain scaling logic 306 to generate a third set of digital data. The second set of digital data may be scaled by logarithmic gain scaling logic 308 to generate a fourth set of digital data. The first and second sets of digital data may be gain scaled differently based on a difference between the fine delays of the high-resolution TDC 302 and the coarse delays of the low-resolution TDC 304. The linear gain scaling logic 306 may correspond to the fine delays of the high-resolution TDC 302. The logarithmic gain scaling logic 308 may correspond to the coarse delays of the low-resolution TDC 304. The third set of data may correspond to a first time difference measured by the high-resolution TDC 302. The fourth set of data may correspond to a second time difference measured by the low-resolution TDC 304.

The third and fourth sets of digital data may be combined by combination logic 310 to generate a fifth set of digital data. In some embodiments, the fifth set of digital data may be substantially equal to a summation of the third and fourth sets of digital data. In other embodiments, the fifth set of digital data may be a different combination of the third and fourth sets of digital data.

The fifth set of digital data may be sent to a digital filter 312. In some embodiments, the digital filter 312 may be designed to reduce noise in the fifth set of digital data. The digital filter 312 may be designed to filter short-term fluctuations not indicative of actual deviations from the target phase difference, preventing the fifth data set from causing the PLL to unnecessarily adjust the phase difference between the reference signal and the signal generated by the oscillator of the PLL. In some embodiments, the digital filter 312 may be used to condition the fifth data set for further processing. The digital filter 312 generates an output. In some embodiments, the output may be a digital code to control a digitally controlled oscillator (DCO). The digital code may be based on the fifth set of data.

In some embodiments, during normal operation, the high-resolution TDC 302 is considered a main TDC that is used while the phase difference between the reference signal and the signal generated by the oscillator of the PLL is stable. In these embodiments, while the phase difference is locked, the dynamic range limit of the high-resolution TDC 302 is not reached. This may be considered a lock path of the TDC recovery system 300. However, when the dynamic range limit of the high-resolution TDC 302 is reached (e.g., the phase difference is unstable), the low-resolution TDC 304 may be automatically triggered and the TDC recovery system 300 may enter a recover path. The TDC recovery system 300 may remain in the recover path until the phase difference is small enough such that the dynamic resolution limit of the high-resolution TDC 302 is no longer reached.

Figure 4:
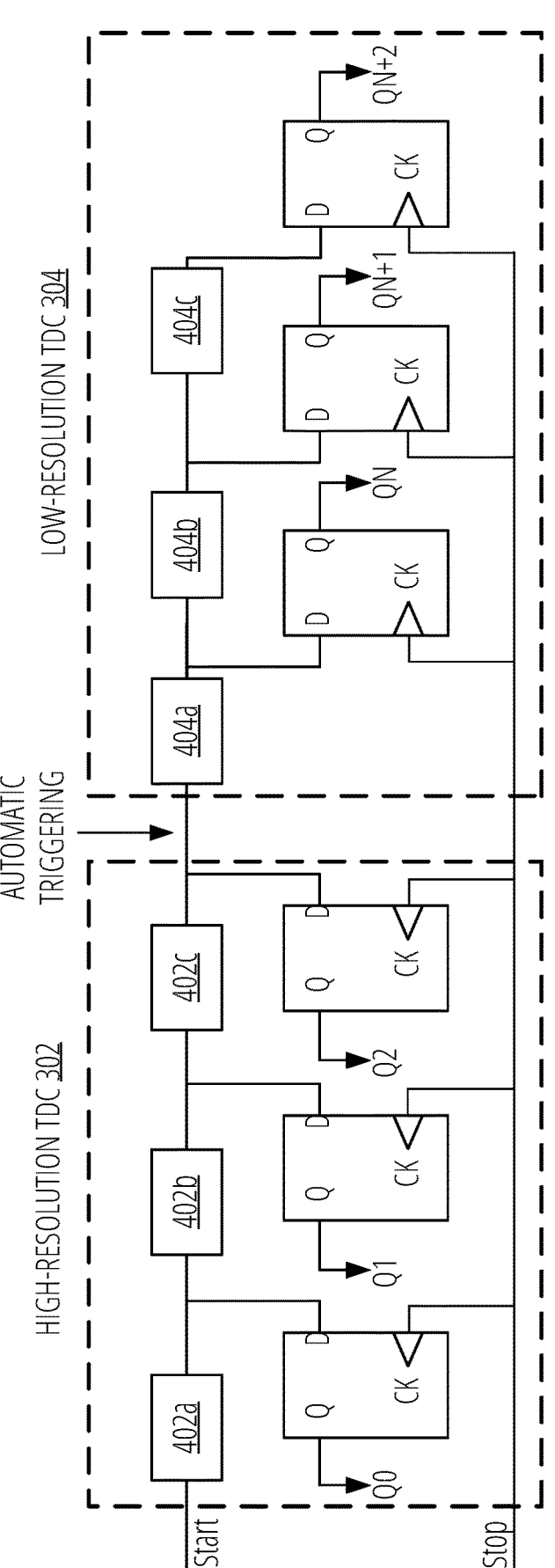
FIG. 4 is a circuit diagram illustrating a TDC recovery system, according to one embodiment.

FIG. 4 is a circuit diagram illustrating a TDC recovery system 400, according to one embodiment. The TDC recovery system 400 may include some or all of the features of the TDC recovery system 300, as described above with respect to FIG. 3. The TDC recovery system 400 may include the high-resolution TDC 302 and the low-resolution TDC 304. The high-resolution TDC 302 may include multiple units of fine delay circuitry 402a, 402b, 402c and corresponding flip-flops. The low-resolution TDC 304 may include multiple units of coarse delay units 404a, 404b, 404c and corresponding flip-flops.

In some embodiments, a third fine delay unit 402c may correspond to a dynamic range limit of the high-resolution TDC 302. The dynamic range limit of the high-resolution TDC 302 may be reached upon the output of third fine delay unit 402c outputting a start signal. An output of the third fine delay unit 402c may be coupled to a first coarse delay unit 404a of the low-resolution TDC 304 such that the low-resolution TDC 304 is automatically triggered upon reaching the dynamic range limit of the high-resolution TDC 302.

While FIG. 4 as illustrated does not include counters, one or more of the high-resolution TDC 302 or low-resolution TDC 304 may include a counter similar to the TDC circuit 100 as described above with respect to FIGS. 1-2C.

FIG. 5 illustrates a method 500 of operation of a TDC, according to one embodiment. The method 500 may be performed by the TDC circuit 100 of FIG. 1 along with accompanying descriptions in FIGS. 2A-C. The operations need not be performed in a specific order, unless explicitly disclosed to be required to be performed in such an order.

At operation 502, method 500 includes tracking, by serially-coupled delay units, an amount of delay in response to receipt of a start signal.

At operation 504, method 500 further includes outputting, by the final delay unit of the serially-coupled delay units, a toggle signal.

At operation 506, method 500 further includes incrementing, by the counter, a first value of the counter in response to receipt of the toggle signal. The counter may increment the first value in response to detecting a transition (e.g., a digital transition) in the toggle signal.

At operation 508, method 500 further includes latching, by the plurality of flip-flops, second values corresponding to outputs from the respective ones of the serially-coupled delay units. The plurality of flip-flops may latch the second values in response to receipt of a stop signal.

At operation 510, method 500 further includes retaining, by the counter, the first value. The counter may retain the first value in response to receipt of the stop signal.

At operation 512, method 500 further includes generating, using the first value and the second values, a digital code. The digital code may be generated by combining the first value and the second values.

Various embodiments of increasing a dynamic range of a TDC described herein may include various operations. These operations may be performed and/or controlled by hardware components, digital hardware and/or firmware, and/or combinations thereof. As used herein, the term "coupled to" may mean connected directly to or connected indirectly through one or more intervening components. Any of the signals provided over various on-die buses may be time multiplexed with other signals and provided over one or more common on-die buses. Additionally, the interconnection between circuit components or blocks may be shown as buses or as single signal lines. Each of the buses may alternatively be one or more single signal lines and each of the single signal lines may alternatively be buses.

Certain embodiments may be implemented by firmware instructions stored on a non-transitory computer-readable medium, e.g., such as volatile memory and/or non-volatile memory. These instructions may be used to program and/or configure one or more devices that include processors (e.g., CPUs) or equivalents thereof (e.g., such as processing cores, processing engines, microcontrollers, and the like), so that when executed by the processor(s) or the equivalents thereof, the instructions cause the device(s) to perform the described operations for USB-C mode-transition architecture described herein. The non-transitory computer-readable storage medium may include, but is not limited to, electromagnetic storage medium, read-only memory (ROM), random-access memory (RAM), erasable programmable memory (e.g., EPROM and EEPROM), flash memory, or another now-known or later-developed non-transitory type of medium that is suitable for storing information.

Although the operations of the circuit(s) and block(s) herein are shown and described in a particular order, in some embodiments the order of the operations of each circuit/block may be altered so that certain operations may be performed in an inverse order or so that certain operation may be performed, at least in part, concurrently and/or in parallel with other operations. In other embodiments, instructions or sub-operations of distinct operations may be performed in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A time-to-digital converter (TDC) circuit comprising:
   delay circuitry comprising a plurality of serially-coupled delay units;
   a feedback loop coupled between a final delay unit of the plurality of serially-coupled delay units and an input to the delay circuitry, the feedback loop comprising an inverter in the feedback loop; and
   a counter having a clock input coupled to an output of the final delay unit, wherein a value of the counter is to be incremented responsive to the counter receiving a toggle signal from the final delay unit.

2. The TDC circuit of claim 1, further comprising an AND gate, wherein a first input of the AND gate is coupled to an output of the inverter, a second input of the AND gate is to receive a start signal, and an output of the AND gate is coupled to a first delay unit of the plurality of serially-coupled delay units.

3. The TDC circuit of claim 1, wherein the delay circuitry comprises a plurality of flip-flops coupled to respective ones of the plurality of serially-coupled delay units, and wherein, responsive to receiving a stop signal, the plurality of flip-flops are to latch outputs of a respective delay unit, of the plurality of serially-coupled delay units, and the counter is to retain the value.

4. The TDC circuit of claim 3, further comprising logic coupled to the delay circuitry, wherein the logic is to, responsive to receiving a stop signal:
   receive outputs from the plurality of flip-flops and the value of the counter; and
   calculate, based on the outputs and the value, a phase difference between a start signal and the stop signal.

5. The TDC circuit of claim 1, wherein the plurality of serially-coupled delay units comprises a first number of delay units, wherein each serially-coupled delay unit is associated with a first time delay, and wherein the value of the counter corresponds to a second time delay equal to at least the first number multiplied by the first time delay.

6. The TDC circuit of claim 1, wherein the counter increments the value responsive to each digital transition of the toggle signal.

7. The TDC circuit of claim 1, wherein each of the plurality of serially-coupled delay units comprises one or more inverters or interpolators, and wherein each of the plurality of serially-coupled delay units is to delay a transition edge of the toggle signal by a first amount of time.

8. A time-to-digital converter (TDC) circuit comprising:
   a plurality of delay units that comprise a first delay unit and a final delay unit, wherein the plurality of delay units are serially-coupled;
   a plurality of flip-flops coupled to the plurality of delay units;
   a counter comprising an input coupled to an output of the final delay unit;
   an inverter comprising an input coupled to the output of the final delay unit; and
   an AND gate comprising a first input coupled to an output of the inverter, a second input configured to receive a start signal, and an output coupled to an input of the first delay unit.

9. The TDC circuit of claim 8, wherein, responsive to the first delay unit receiving the start signal:

each respective delay unit, of the plurality of delay units, is to output a delayed version of the start signal;

the final delay unit is to output a toggle signal;

the counter is to increment a value of the counter in response to receipt of the toggle signal; and the inverter is to generate an inverted toggle signal by inverting the toggle signal.

10. The TDC circuit of claim 9, wherein:

each respective delay unit, of the plurality of delay units, is to output a delayed version of the inverted toggle signal;

the counter is to increment the value of the counter in response to receipt of the inverted toggle signal; and the inverter is to generate a twice-inverted toggle signal by inverting the inverted toggle signal.

11. The TDC circuit of claim 8, wherein, responsive to receiving a stop signal, a first flip-flop of the plurality of flip-flops is to latch a first value of a first signal outputted by the first delay unit of the plurality of delay units, a second flip-flop of the plurality of flip-flops is to latch a second value of a second signal outputted by the final delay unit of the plurality of delay units, and the counter is to retain a third value.

12. The TDC circuit of claim 11, further comprising circuitry coupled to the plurality of flip-flops, wherein the circuitry is to determine, based on the first value, the second value, and the third value, a digital code to control a digitally controlled oscillator (DCO).

13. The TDC circuit of claim 11, further comprising logic coupled to the first and second flip-flops and the counter, wherein the logic is to:

receive the first, second, and third values; and calculate, using the first, second, and third values, a phase difference between the start signal and the stop signal.

14. The TDC circuit of claim 8, wherein each of the plurality of delay units correspond to a first amount of time and each increment of a value of the counter corresponds to a multiple of the first amount of time.

15. The TDC circuit of claim 8, wherein the first delay unit and the final delay unit comprise one or more inverters or interpolators.

16. A method of operating a time-to-digital converter (TDC) circuit, the TDC circuit comprising a plurality of serially-coupled delay units, a plurality of flip-flops coupled to respective ones of the serially-coupled delay units, a counter coupled to an output of a final delay unit of the plurality of serially-coupled delay units, and logic coupled to the plurality of flip-flops and the counter, wherein the method of operating the TDC circuit comprises:

at a first time:

tracking, by the serially-coupled delay units, an amount of delay in response to receipt of a start signal;

outputting, by the final delay unit, a toggle signal; and incrementing, by the counter, a first value of the counter in response to receipt of the toggle signal;

at a second time, after the first time and responsive to receiving a stop signal:

latching, by the plurality of flip-flops, second values corresponding to outputs from the respective ones of the serially-coupled delay units; and retaining, by the counter, the first value; and generating a digital code using the first value and the second value.

17. The method of claim 16, wherein the TDC circuit further comprises an inverter coupled to the output of the final delay unit, the method further comprising:

at the first time:

inverting, by the inverter, the toggle signal to generate an inverted toggle signal;

at a third time between the first time and the second time:

outputting, by the final delay unit, the inverted toggle signal; and inverting, by the inverter, the inverted toggle signal to generate a twice-inverted toggle signal; and at a fourth time between the third time and the second time:

outputting, by the final delay unit, the twice-inverted toggle signal; and incrementing, by the counter, the value of the counter in response to receipt of the twice-inverted toggle signal.

18. The method of claim 16, wherein generating the digital code comprises combining the first value and the second value.

19. The method of claim 16, further comprising incrementing, by the counter, the value in response to detecting a transition in the toggle signal.

\*   \*   \*   \*   \*